United States Patent
Lehman

(10) Patent No.: US 7,096,752 B1
(45) Date of Patent: Aug. 29, 2006

(54) ENVIRONMENTAL DAMAGE REDUCTION

(75) Inventor: Kurt R. Lehman, Menlo Park, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/979,489

(22) Filed: Nov. 2, 2004

(51) Int. Cl.
*G01M 19/00* (2006.01)

(52) U.S. Cl. ........................ 73/865.8; 438/14

(58) Field of Classification Search .......... 73/865.6, 73/865.9, 865.8; 438/14
See application file for complete search history.

(56) References Cited

U.S. PATENT DOCUMENTS

| | | | | |
|---|---|---|---|---|
| 4,894,748 A | * | 1/1990 | Shefet | 361/687 |
| 5,360,980 A | * | 11/1994 | Borden et al. | 250/573 |
| 5,872,633 A | | 2/1999 | Holzapfel et al. | 356/630 |
| 6,628,397 B1 | | 9/2003 | Nikoonahad et al. | 356/445 |
| 6,885,431 B1 | * | 4/2005 | Hara | 355/53 |
| 2002/0014084 A1 | * | 2/2002 | Kaneda et al. | 62/176.6 |
| 2004/0105738 A1 | * | 6/2004 | Ahn et al. | 414/222.01 |
| 2004/0124084 A1 | * | 7/2004 | Lee et al. | 204/600 |
| 2005/0123020 A1 | * | 6/2005 | Nakamura | 374/14 |
| 2005/0175775 A1 | * | 8/2005 | Shirley | 427/240 |

* cited by examiner

*Primary Examiner*—Daniel S. Larkin
*Assistant Examiner*—Nashmiya Fayyaz
(74) *Attorney, Agent, or Firm*—Luedeka, Neely & Graham, P.C.

(57) ABSTRACT

A substrate processor that processes and inspects a substrate. A substrate handler moves a substrate within the substrate processor. A processing chamber receives the substrate from the substrate handler, and processes the substrate using damaging material that is retained to some extent by the substrate. An inspection tool receives the substrate from the substrate handler after the substrate has been processed. A controlled environment surrounds at least a portion of the inspection tool and the substrate. A purge gas supply provides a purge gas at a flow rate. A moisture control unit adjusts the purge gas to a relative humidity, and gas inlets direct the purge gas into the controlled environment.

12 Claims, 1 Drawing Sheet

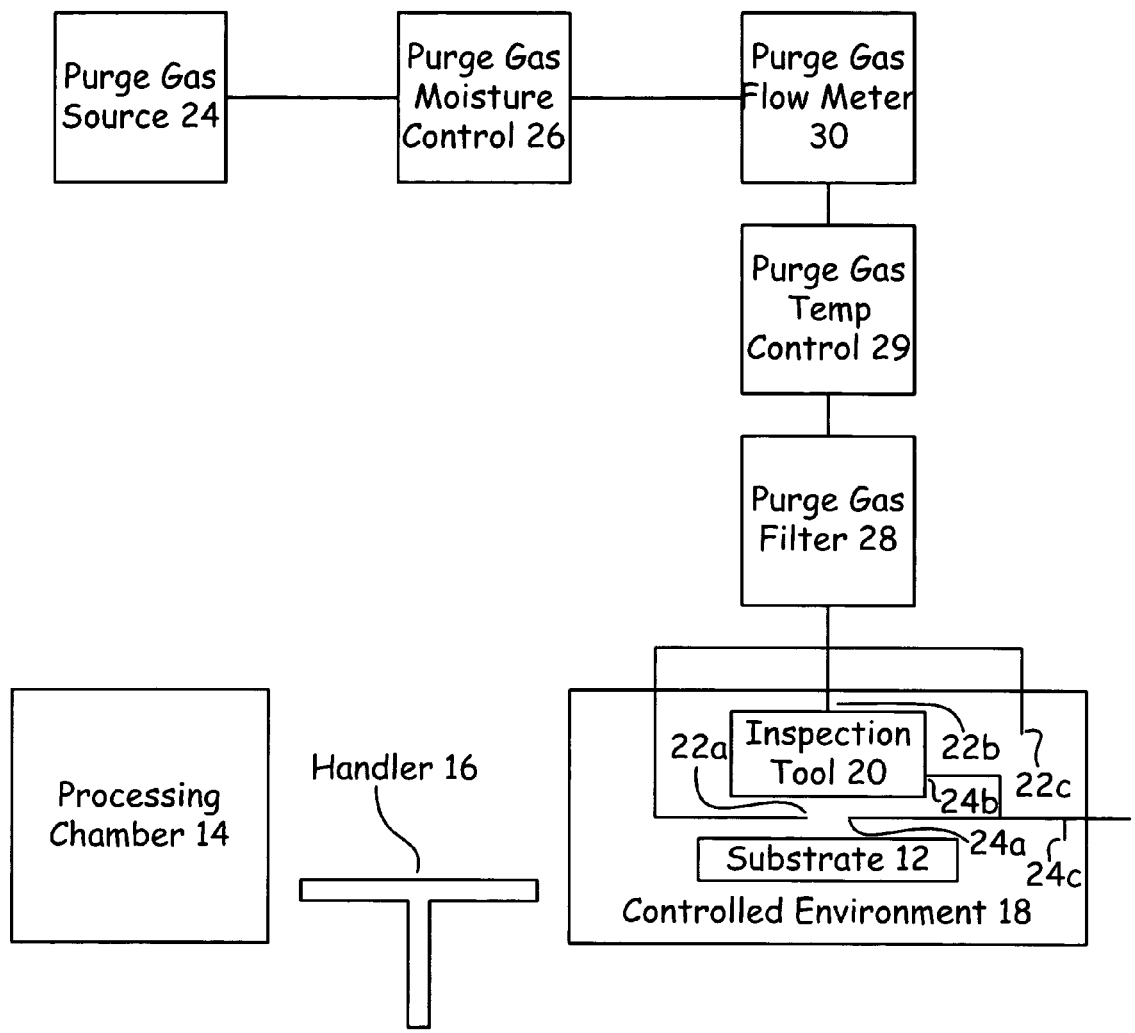

ENVIRONMENTAL DAMAGE REDUCTION

FIELD

This invention relates to the field of integrated circuit fabrication. More particularly, this invention relates to inline measurement of integrated circuit substrates that include corrosive or contaminating materials.

BACKGROUND

Fabrication of integrated circuits requires constant inspection and testing of the structures that are formed, so as to ensure that the processes are in control, the materials are not contaminated, and the structures are properly formed. As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Typically, such inspections have been performed off line for many processes, such as for etch processes, because the substrates exiting such processes tend to outgas corrosive or contaminating materials, such as hydrogen bromide, chlorine, sulfuric acid and other materials. When inspection tools are subjected to such corrosive materials, they tend to be damaged in a relatively short length of time. Because of the relatively high cost of such equipment, such damage to the instrument is unacceptable. Thus, most inspection is done well after the process in question, such as after the substrates have been baked, cleaned, rinsed, or otherwise had the corrosive materials removed from them.

There have been some attempts to protect the inspection tools from the damaging environment produced by out gassing substrates. For example, one approach encloses the metrology device in an enclosure that includes a window, through which the measurements are made, and thus keeping the substrate separate from the measurement device. Unfortunately, some measurements cannot be made through a window in this manner.

Another approach protects individual components of the inspection tool, such as by coating circuit boards with a protective conformal coating. However, it may not be possible to apply such a coating to all of the components of the tool that are susceptible to damage from the corrosive environment. Further, methods such as these tend to reduce both measurement speed and substrate throughput. These approaches also do not address the problem of particulate contamination of the substrates and the tools, due, for example, to the formation of hydrates from the contaminating materials, such as hydrogen bromide, chlorine, and so forth.

What is needed, therefore, is a system that overcomes problems such as those described above, at least in part.

SUMMARY

The above and other needs are met by a method of inspecting a substrate that includes corrosive materials, using an inspection tool. A controlled environment is created around at least a portion of the inspection tool and the substrate. A purge gas is flowed at a flow rate, and adjusted to a relative humidity. The purge gas is directed into the controlled environment, and the substrate is inspected with the inspection tool.

In this manner, the controlled relative humidity of the purge gas reduces, and preferably prohibits, formation of hydrous and other corrosive gases and their hydrates that otherwise emit from the substrate. In other words, without moisture from the purge gas, the corrosive nature of the corrosive materials or damaging particulates tends to be reduced to a level that does not damage the inspection tool.

In various embodiments according to this aspect of the invention, the corrosive material includes at least one of bromine, fluorine, chlorine, and sulfuric acid. The controlled environment is created around all of the inspection tool in some embodiments. The purge gas may be directed at a location between the inspection tool and the substrate, and is preferably directed from multiple locations into the controlled environment. The relative humidity of the purge gas is preferably adjusted to be no more than about twenty percent, and most preferably is adjusted to be substantially about zero percent. In some embodiments the flow rate of the purge gas is about thirty standard cubic feet per minute. Preferably, the purge gas is filtered to remove particulates.

According to another aspect of the invention there is described an apparatus that inspects a substrate that includes corrosive materials, where the apparatus includes an inspection tool. A controlled environment surrounds at least a portion of the inspection tool and the substrate. A purge gas supply provides the purge gas at a flow rate. A moisture control unit adjusts the purge gas to a relative humidity. Gas inlets direct the purge gas into the controlled environment. The apparatus preferably includes a filter to remove particulates from the purge gas.

According to yet another aspect of the invention there is described a substrate processor that processes and inspects a substrate. A substrate handler moves a substrate within the substrate processor. A processing chamber receives the substrate from the substrate handler, and processes the substrate using corrosive materials that are retained to some extent by the substrate. An inspection tool receives the substrate from the substrate handler after the substrate has been processed. A controlled environment surrounds at least a portion of the inspection tool and the substrate. A purge gas supply provides a purge gas at a flow rate. A moisture control unit adjusts the purge gas to a relative humidity, and gas inlets direct the purge gas into the controlled environment.

In various embodiments according to this aspect of the invention, the processing chamber is an etch chamber. Preferably, the moisture control unit is adapted to adjust the relative humidity of the purge gas to be no more than about twenty percent, and most preferably to be no more than substantially about zero percent. A flow meter preferably adjusts the flow rate of the purge gas. Preferably, a filter removes particulates from the purge gas.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which depicts a functional block diagram of an apparatus according to a preferred embodiment of the invention.

DETAILED DESCRIPTION

With reference now to the FIGURE, there is depicted a processing system 10 according to a preferred embodiment of the present invention. The system 10 is adapted to process a substrate 12, such as in a processing chamber 14. Although the embodiments of the invention as described herein are applicable to processes that do not use damaging materials, and for which damaging materials are not retained by the substrate 12, the embodiments are more particularly applicable to those processes in which damaging materials are used in the processing of the substrate 12, and in which at least some of those damaging materials are retained by the substrate 12. As used herein, the term "damaging" materials generally refers to corrosive or contaminating materials, or materials that are in any other way detrimental to either the equipment or the process.

For example, in a most preferred embodiment the processing chamber 14 is an etch chamber, such as one that uses a corrosive fluid to etch the substrate 12. For example, materials containing elements such as bromine, fluorine, and chlorine are often used in the integrated circuit fabrication industry for etching substrates 12. These corrosive materials tend to be retained to some degree, and in one form or another, in the substrate 12, even after the processing is completed in the processing chamber 14.

A handler 16 is preferably used to move the substrate 14 both into and out of the processing chamber 14, and then into a controlled environment 18. Preferably, the substrate 12 is inspected in the controlled environment 18, such as by inspection with the inspection tool 20. The inspection tool 20 may take many different forms. For example, the inspection tool 20 may be an optical inspection system, or a metrology system, or in some embodiments may be a spectroscopy system.

In various embodiments, the inspection tool 20 is at least partially surrounded with the controlled environment 18, and may be entirely surrounded by the controlled environment 18. In some embodiments—not explicitly depicted—a door separates the inspection tool 20 from the processing chamber 14, and the processing chamber 14 becomes the controlled environment 18, and there is no separate controlled environment 18 disposed apart from the processing chamber 14.

The controlled environment 18 preferably includes at least one purge gas inlet nozzle 22. The purge gas is preferably provided by a purge gas source 24, such as a supply of a relatively clean and dry gas. The gas may be either a relatively inert gas, such as nitrogen or argon, or may be air. The purge gas is preferably passed through a moisture control 26, which adjusts the moisture content in the purge gas, such as may be measured by relative humidity. Most preferably, the moisture control 26 reduces the relative humidity of the purge gas. The relative humidity is preferably reduced to be no more than about twenty percent, and most preferably is reduced to substantially about zero percent. The importance of adjusting the purge gas moisture content is described in more detail hereafter.

The purge gas is also preferably metered through a flow meter 30, by which the amount of purge gas flowing into the controlled environment 18 can be controlled as desired. For example, a flow rate sufficient to maintain a desired overpressure, or to change out the atmosphere with the controlled environment 18 within a given amount of time may be desired. The purge gas is optionally processed through a temperature controller 29, which selectively adjusts the temperature of the purge gas, such as by either heating or cooling the purge gas to a desired temperature. This preferably precisely controls and stabilizes the controlled environment 18, which has a generally beneficial effect on performance.

Most preferably, the purge gas is also filtered though a filter 28, which removes particulates from the purge gas. As particulate matter tends to be extremely disruptive to the proper fabrication of integrated circuits, the degree of filtering is preferably tuned so as to remove the sizes and amounts of particulate matter as is important for proper fabrication of the integrated circuits in question.

The purge gas is preferably delivered to the controlled environment 18 through one or more of the nozzles 22, as described above. The nozzles 22 may take on many different configurations. For example, nozzle 22a delivers the purge gas to a location that is disposed between the substrate 12, which is a source of corrosive material, and the inspection tool 20, which can be damaged by the corrosive material expelled from the substrate 12. In this manner, any corrosive material that is expelled from the substrate 12 can be flushed away from the inspection tool 20.

Nozzle 22b delivers the purge gas to a location within the inspection tool 20. In this manner, an overpressure of purge gas can be created within the inspection tool 20, thus decreasing the likelihood that any amount of the corrosive material would enter the inspection tool 20. Finally, nozzle 22c delivers the purge gas to a general location within the controlled environment 18, thus creating an overpressure generally within the controlled environment 18, which tends to prohibit other gases from entering the controlled environment 18. As mentioned above, either one or all three of these or other nozzle 22 locations can be used, and a greater or lesser number of nozzles 22 can also be used in any combination of the locations.

The purge gas preferably has a relatively low moisture content, as described above, because it has been determined that one vector by which the corrosive materials in the substrate 12 attain and damage the inspection tool 20 is by forming hydrous compounds with water vapor that is present within the ambient atmosphere that typically surrounds the inspection tool 20 and the substrate 12 during a prior art inspection process. These hydrous compounds, such as hydrogen bromide, hydrogen fluoride, hydrogen chloride, and other materials are extremely corrosive to the metal and other parts within the inspection tool 20.

However, by purging the area within the controlled environment 18 with a purge gas from which moisture has been removed, as described above, these corrosive compounds tend to not form to the degree that they otherwise would, and thus the inspection tool 20 is not subjected to the same corrosive environment that it typically would be. It is appreciated that the present invention is also applicable to other corrosive materials that tend to be either formed or borne, at least in part, by water vapor within the ambient environment.

The purge gas is preferably exhausted from the controlled environment 18 through one or more ports 24. The ports 24 may take on many different configurations. For example, port 22a exhausts the purge gas from a location that is disposed between the substrate 12, which is a source of corrosive material, and the inspection tool 20, which can be damaged by the corrosive material expelled from the substrate 12. In this manner, any corrosive material that is expelled from the substrate 12 can be flushed away from the inspection tool 20.

Port 24b exhausts the purge gas from a location within the inspection tool 20. Finally, port 24c exhausts the purge gas from a general location within the controlled environment 18. Any one or more of these or other port 24 locations can be used, and a greater or lesser number of ports 24 can also be used in any combination of the locations, and in any combination with a variety of nozzles 22, as described above.

Thus, the various embodiments of the present invention comprehend a method for inspecting a substrate 12 with an inspection tool 20, a modified inspection tool 20 for inspecting a substrate 12, and a processing system 10 for processing and inspecting a substrate 12, where in each embodiments the corrosive materials retained by the substrate 12 do not damage the inspection tool 20.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A substrate processor adapted to process and inspect a substrate, the substrate processor comprising:
    a substrate handler,
    a processing chamber adapted to receive the substrate from the substrate handler, and process the substrate using damaging material that is retained to some extent by the substrate,
    an inspection tool adapted to receive the substrate from the substrate handler after the substrate has been processed,
    a controlled environment adapted to surround at least a portion of the inspection tool and the substrate,
    a purge gas supply adapted to provide a purge gas at a flow rate,
    a moisture control unit adapted to adjust the purge gas to a relative humidity, and
    gas inlets adapted to direct the purge gas into the controlled environment, thereby reducing expulsion of corrosive materials from the damaging material within the controlled environment, where the damaging material would otherwise cause damage to the inspection tool without the flow of the purge gas.

2. The substrate processor of claim 1, wherein the damaging material includes at least one of bromine, fluorine, chlorine, and sulfuric acid.

3. The substrate processor of claim 1, wherein the controlled environment is created around all of the inspection tool.

4. The substrate processor of claim 1, wherein the purge gas is directed at a location between the inspection tool and the substrate.

5. The substrate processor of claim 1, wherein the purge gas is directed from multiple locations into the controlled environment.

6. The substrate processor of claim 1, wherein the purge gas is exhausted from a location between the inspection tool and the substrate.

7. The substrate processor of claim 1, wherein the purge gas is exhausted from multiple locations in the controlled environment.

8. The substrate processor of claim 1, further comprising the step of adjusting the purge gas to a desired temperature.

9. The substrate processor of claim 1, wherein the processing chamber is an etch chamber.

10. The substrate processor of claim 1, wherein the moisture control unit is adapted to adjust the relative humidity of the purge gas to be no more than about twenty percent.

11. The substrate processor of claim 1, wherein the moisture control unit is adapted to adjust the relative humidity of the purge gas to be no more than substantially about zero percent.

12. The substrate processor of claim 1, further comprising a filter to remove particulates from the purge gas.

* * * * *